(12) United States Patent
Berco

(10) Patent No.: US 8,482,988 B2
(45) Date of Patent: Jul. 9, 2013

(54) METHOD OF OPERATING A FLASH EEPROM MEMORY

(76) Inventor: Dan Berco, Kiryat Ata (IL)

( * ) Notice: Subject to any disclaimer, the term of this patent is extended or adjusted under 35 U.S.C. 154(b) by 72 days.

(21) Appl. No.: 13/291,105

(22) Filed: Nov. 8, 2011

(65) Prior Publication Data
US 2013/0114346 A1      May 9, 2013

(51) Int. Cl.
*G11C 16/04*      (2006.01)

(52) U.S. Cl.
USPC ............ 365/185.29; 365/185.27; 365/185.28; 365/185.18

(58) Field of Classification Search
USPC .............. 365/185.27–185.29, 185.18, 185.33
See application file for complete search history.

(56) References Cited

U.S. PATENT DOCUMENTS

| | | | | |
|---|---|---|---|---|
| 7,796,443 B2* | 9/2010 | Berco | ...................... | 365/185.29 |
| 7,969,790 B2* | 6/2011 | Mirgorodski et al. | ... | 365/185.29 |

* cited by examiner

*Primary Examiner* — David Lam

(57) ABSTRACT

The invention is a new method for operating a flash EEPROM memory device and in particular for programming and erasing the device. The memory device has a first semiconductor region within a second semiconductor region, source and drain regions in the first semiconductor region, a well terminal inside the first semiconductor region, a charge storing layer electrically isolated from the first semiconductor region by a dielectric layer, and a control terminal electrically isolated from the charge storing layer by a inter layer dielectric. The method comprises the steps of: applying a first voltage bias of first polarity to the well terminal; allowing a first time period to elapse; resetting the first voltage bias to zero; while during the either the ramp up or the ramp down phase of said first voltage; applying a second voltage bias of second polarity opposite to the first polarity to the control terminal; allowing a second time period to elapse; and resetting the second voltage bias to zero.

20 Claims, 6 Drawing Sheets

METHOD OF OPERATING A FLASH EEPROM MEMORY

BACKGROUND OF THE INVENTION (a) Field of the Invention

This invention relates to the operation of a non volatile flash memory device and in particular to programming and erasing the device by manipulating the stored charge within.

(b) Description of the Related Art

A flash EEPROM device is a semiconductor device having non volatile memory properties which can be electrically programmed and erased. The non volatile memory properties enable the device to retain stored information once the power is turned off. The information is in the form of electrons stored within the floating gate. Devices of this type are described in U.S. Pat. Nos. 4,698,787 [1] and 5,077,691, [2] all of which are incorporated herein by reference. Other similar devices of this type are also described in U.S. Pat. Nos. 5,243,559, [3] 5,361,235, [4] 5,457,652, [5] 5,790,460 [6] and 5,572,464, [7] all of which are incorporated herein by reference.

Flash EEPROM devices are electrically erasable, programmable, read-only memory devices, which are electrically programmed and erased using on chip high and negative voltage generation circuitry. Data is stored in a binary format in the device in a manner that the device is set to a programmed state and reset to an erased state. Programming the device is accomplished by storing electrons in a floating gate or charge storing layer usually by means of tunneling or hot carrier injection. Erasing the device is done by removing the charge usually by means of tunneling.

In the prior art there are several programming and erase techniques for a flash memory mostly based on the physical phenomena of charge tunneling through a potential barrier. Implementation of tunneling erase techniques requires the usage of large electrical field across the dielectric between the floating gate and the well. These high electrical fields are known to generate reliability issues that degrade the quality of the dielectric which would eventually cause device failure. As devices advance further into sub micron dimensions, the intensity of the electric fields grow higher to become a dominating factor limiting the device scale down process.

Conventional flash device erase is achieved by application of a large negative voltage to the control gate and simultaneous application of a moderate positive voltage to the source region. This technique is usually referred to as Negative Gate Source Erase (NGSE). A variation to this method uses both source and drain regions in the erase process at the same time with the exact same bias operation methodology. FIG. 1 shows a prior art flash device using Fowler-Nordheim tunneling for NGSE. The device 9 is fabricated on a P-type substrate 10 which is maintained at ground potential, while a large negative potential Vg of about −11V is applied to the control gate 11 and simultaneously a positive potential Vs of about 5V is applied to the source region 12, fabricated from an n+ type semiconductor inside an n− region 15. The drain region 8 is kept floating throughout the process. The electrical field formed across the dielectric layer 19 between the floating gate and the substrate would yield a tunneling current draining the electrons stored in the floating gate.

This erase scheme suffers from a reliability issue caused by "hot hole" injection from the substrate 10 into the tunneling dielectric 19 [I-III]. Since the source region 16 is reversed biased during the erase operation, a band to band tunneling current is present at the surface 17. This tunneling current produces energetic holes that are attracted by the floating gate to source electric field and have a probability for tunneling into the floating gate. This probability is directly related to the magnitude of this electric field. Thus, the "hot hole" current has a strong dependency on the electric field and imposes yet another limit on device sizing as well as on operation voltage levels. The stronger the electric field the larger the tunneling current and vice versa. These "hot hole" cause damage to the semiconductor insulator interface 17 and the dielectric layer 19 by generating interface states and inter dielectric traps. Given enough time, these traps would line up to cause a breakdown of the insulator layer and rend the device useless, a phenomena known as Time Dependent Dielectric Breakdown (TDDB). TDDB theory presents an exponential dependency of the breakdown probability and time to failure of the device on the electrical field strength and stress duration. Attempting to prolong the time to failure by lowering the electric field would result in exponentially longer erase times since the Fowler-Nordheim tunneling current density has an inverse exponential dependency as well and would decrease with lower electric fields. Furthermore, by using NGSE the hot hole tunneling current is localized beneath the source and floating gate overlapping area and the likelihood of the dielectric traps to line up and form a breakthrough path is high.

Referring to FIG. 2, another prior art erase technique is presented using a p-type well structure 24. The p-well 24 is contacted using a p+ region 29 and formed in a deep n-type well 25. The n-well 25, which may be contacted using an n+ region 36, is formed within a p-type substrate 23. This erase technique uses a large negative bias potential Vg applied to the control gate 21 of about −11V while simultaneously applying a positive bias potential Vb of about 5V to the p-well 24 via the well terminal 29. The charge storing layer 28, also referred to as floating gate, lies beneath the control gate 21 with a dielectric 34 forming an intermediate insulating layer. Usually the p-type substrate 23 is grounded and the n-well 25 is kept floating during the erase operation. The source region 30 and the drain region 31 are either kept floating [3] or at the same potential as the p-well 24 [6], causing the electrons stored in the floating gate 28 to tunnel vertically 37 through the tunneling oxide 33 and into the channel region 22. This prior art erase technique is commonly referred to as Negative Gate Channel Erase (NGCE).

The NGCE technique suffers from a different reliability problem. Since the charge is erased into the channel region 22, by using high electric fields a high energy, a tunneling electron could impact ionize the semiconductor interface to generate an electron hole pair. This energetic hole, as in the previously presented NGSE method, would be attracted by the same high electric field and tunnel back through the dielectric layer 34 into the floating gate 28. This "hot hole" tunneling current would have the same affect on the dielectric quality and cause degradation over time. However, since in this case, the surface states and inter-dielectric traps are distributed along the entire channel length, most of the performance penalty would be manifested in device read current degradation and reduced programming performance. The impact on programming efficiencies results from the fact that these traps interfere with the hot carrier injection process.

Another prior art variation for NGCE technique [6] utilized the same biasing potential application for the p-type well 24 and the source region 30. This technique attempts to minimize the reliability problems induced by hot hole injection by applying the same potential bias to the source and the well, thus minimizing the band to band tunneling the would otherwise occur at the source dielectric interface 26. This prior art technique, however, does not eliminate the need for using high electric field across the dielectric during erase and the resulting TDDB and performance degradation issues.

FIG. 3 shows the biasing voltage waveform time dependence used to operate the flash device during erase in the prior art. All prior art techniques use an operation methodology that dictates a simultaneous application of the bias pulses for the control gate and the well either with or without the source and drain regions (the latter are either operated in the same manner as the well or kept floating). Since tunneling is the main mechanism used in erasing the device it is necessary to generate a strong electrical field over the dielectric during erase. As a result, the potential difference between the control gate and the well should be the highest obtainable. The well bias waveform has a finite rise and fall times and a positive polarity while the control gate bias waveform simultaneously assumes a negative polarity. The effective erase time for tunneling to occur is the actual overlap time of these two waveforms when the electric field is maximized. All prior art techniques attempt to maximize the overlap time between these waveforms in order to get the maximal electrical field during the erase sequence making them highly vulnerable to the above mentioned reliability issues. Another drawback of this prior art operation methodology is that the biasing scheme would also yield an electric field across the control gate to floating gate dielectric that would induce charge tunneling from the former to the latter. This tunneling current would interfere with the erase process by adding charge to the floating gate.

In the prior art there are several programming techniques for a flash memory based on the physical phenomena of charge tunneling through a potential barrier. Implementation of these Fowler-Nordheim tunneling based programming techniques requires the usage of large electrical field across the dielectric as for the erase case. Tunneling based programming is achieved simply by reversing the polarity of the applied bias to the control gate and source and well terminals, thus reversing the direction of the tunneling current. In particular by application of a large positive voltage to the control gate and simultaneous application of a moderate negative voltage to the well region. A variation to this method uses both source and drain regions along with the well region in the programming process at the same time with the exact same bias operation methodology. The merits of having a large electric field across the dielectric layer are inherent to the tunneling based programming scheme as for the tunneling based erase scheme.

Referring to FIG. 2, a prior art program technique is presented using a p-type well structure 24. The p-well 24 is contacted using a p+ region 29 and formed in a deep n-type well 25. The n-well 25, which may be contacted using an n+ region 36, is formed within a p-type substrate 23. This program technique uses a large positive bias potential Vg applied to the control gate 21 of about 10V [7] while simultaneously applying a positive bias potential Vb of about 10V to the p-well 24 via the well terminal 29. The source region 30 is grounded while the drain region 31 is kept floating or at the same potential as the source, causing the electrons from the source and drain to tunnel vertically 38 through the tunneling oxide 33 and into the floating gate 28.

When inter dielectric charge traps are present under the floating gate (as shown in FIG. 4 as 41b), the tunneling current from the floating gate to the well has two major components: the direct tunneling component (marked 37b as in FIG. 4) and the indirect tunneling component. The direct component is that of charge having sufficient energy to overcome the potential barrier and tunnel to the well, also commonly referred to as Fowler-Nordheim tunneling or "Field Emission". The indirect component or trap assisted tunneling comprises of two stages. The first stage being the tunneling of charge from the floating gate to the trap (marked 38b in FIG. 4) and the second being tunneling of the same charge from the trap to the well (marked 39b in FIG. 4).

Application of high electric fields across the dielectric layer over time results in bond breaking in the dielectric molecular structures which serves as a charge trap. This trap, depending on its nature, can either capture a negative charge (i.e. electron) or a positive charge (i.e. hole). Given enough time these traps would align to form a conducting path from the floating gate to the source or substrate region. Once this occurs the device is considered to be broken down. The bond breaking process has a complex dependency on the applied electrical field stress time. In case the electric field is applied for a short period of time, some of the resulting traps are reversible in nature in a sense that the trapped charge will be released and the molecular bond will recover and remain intact after the removal of the stress. If the stress is applied for longer time periods, the broken bond is unrecoverable and a permanent trap is formed. Well known phenomena such as "Stress Induced Leakage Current" (SILC) [VI] and "Negative Bias Temperature Instability" (NBTI) [VII] may be explained by the reversible nature of these traps.

Dielectric film properties are modified as a result of trap generation as well, which in turn affects device performance. In the case of a silicon dioxide dielectric, "Anode Hydrogen Release" (AHI) [VIII] is a known phenomenon that results from electrical stress induced bond breaking and release of Hydrogen atoms. The Hydrogen is incorporated into the dielectric thin film during the manufacturing process in order to neutralize surface traps commonly referred to as "surface states". Once the Hydrogen atoms are released from the surface, they migrate by means of diffusion through the dielectric layer and render its electrical properties as well as affecting the device's switching properties.

Dielectric trap generation of silicon (Si) based devices having silicon dioxide (SiO2) as a dielectric film has been widely investigated over the past decade. Trap generation as a result of the applied electric stress is commonly classified into two major categories [VIIII]. The first kind, referred to as surface traps 'Nit', caused by silicon-hydrogen bond breaking at the Si—SiO2 interface, resulting in hydrogen diffusion into the bulk oxide and having a partially recoverable nature. The second kind, referred to as oxide traps 'Not' (either at the bulk oxide or the interface), is the result of silicon:oxygen bond breaking and having a non recoverable nature. The non recoverable traps are caused by hot holes, created by Fowler-Nordheim stress during erase operation or impact ionization in the bulk Si during channel hot electron program operation, and injected into the dielectric layer. Minimizing the mechanisms of hot hole generation during device operation is a key factor in maximizing device reliability and lifetime.

High electric fields present between the control gate and the well are known to result in an unwanted leakage current between the floating gate and the control gate. This tunneling based leakage has an exponential dependence on the electric field and interferes both with program and erase of the device. Referring to FIG. 2, the charge tunneling between the control gate 21 and the floating gate 28 will always be in an opposite direction to the program or erase tunneling current and reduce the operation efficiency while increasing the overall power dissipation. Both FIGS. 3 and 5 demonstrate prior art operating methods which cause the above mentioned high electric fields. Referring to FIG. 3, a common prior art erase method waveform is depicted where the channel 22 is biased to a potential opposite to the stored charge 32 while the control gate 21 is biased to an opposite potential at the same time in order to allow the stored charge in the floating gate 28 to tunnel 37 to the channel. Referring to FIG. 5, a common prior art program method waveform is depicted where the control gate 21 is biased to a potential opposite to the stored charge 32 while the channel 22 is biased to an opposite potential at the same time in order to allow charge from the channel to tunnel into the floating gate 28. It is clear that the simultaneous application of opposite bias voltages across the dielectric layer 35 is the reason for these high electric fields. One prior art program and erase method that addresses the above mentioned issues is described in U.S. Pat. No. [8] 7,796,443, and having the operation voltage waveforms shown in FIGS. 7 and 8. Referring to FIGS. 7 and 8, the biasing voltage waveform time dependence used to operate the flash device during erase are shown. The well biasing voltage is of a positive polarity and the control gate biasing is of a negative polarity. By applying the first positive voltage to the well during the first stage, the inter dielectric and surface state traps would be forced to deplete from any stored charge within, while during the second stage, where the first bias is reset and the gate voltage inversely biased, charge is removed from the floating gate by direct and indirect, trap assisted, tunneling currents.

The background and associate prior art erase procedures are described in the following publications: [I] Witters, et al., "Degradation of Tunnel Oxide Floating Gate EPROM Devices and Correlation With High-Field-Current-Induced Degradation of Thin Gate Oxides", IEEE Transactions On Electron Devices, Vol. 36, No. 9, September 1989, p. 1663. [II] Chun, et al., "Lateral Distribution of Erase Induced Hole Trapping and Interface Traps in Flash EPROM NMOSFET Devices", IEEE Semiconductor Interface Specialists Conference, 1996. [III] A. Yokozawa, et al., "Investigation for Degradation of the Retention Characteristics due to Oxide Traps Induced by Hole Injection", NVMSW proc. 1998 pp. 83-85. [IV] S. G. Dmitriev, Y. V. Markin, "Macroscopic Ion Traps at the Silicon Oxide Interface", Semiconductor, Vol. 32, pp. 625-628, June 1988. [V] Vertoprakhov et al., "The effect of mobile charge in silicon dioxide on the surface states density of mos structure", Russian Physical Journal, Vol. 19, pp. 378-379. [VI] Hu et al., "Stress induced current in thin silicon dioxide films", IEDM '92. [VII] Kimizuka et al."NBTI enhancement by nitrogen incorporation into ultrathin gate oxide", symposium on VLSI 2000. [VIII] DiMaria et al., "Hydrogen Electrochemistry and Stress-Induced Leakage Current in Silica," PRL. 83, (1999). [VIIII] Mahapatra et al., "On the Generation and Recovery of Interface Traps in MOSFETs Subjected to NBTI, FN and HCI stress", IEEE Trans. On Elect. Devices, July 2006.

BRIEF SUMMARY OF THE INVENTION

As a means to avoid the problems described in prior art techniques, a novel operation method for flash devices is presented. One object of an embodiment of the invention is to provide a method of programming and erasing a flash electrically erasable, programmable, read-only memory device, which allows both the usage of lower levels of biasing voltages and of shorter biasing pulse durations thus inherently having a lower vulnerability to the electrical field stress induced reliability issues and higher operation efficiency.

A flash memory device having a first semiconductor region of one conductivity type formed within a second semiconductor region of an opposite conductivity type, source and drain regions formed from a semiconductor layer of the opposite conductivity type in the first semiconductor region, a well terminal formed from a semiconductor layer of the conductivity type inside the first semiconductor region, a charge storing layer electrically isolated from the first semiconductor region by a dielectric layer and having electric charge retention properties, and a control terminal electrically isolated from the charge storing layer by a inter layer dielectric and constructed in a manner to have an electric coupling to the charge storing layer.

The erase method in the present invention comprising of the following steps:

(1) Application of a first voltage bias of one polarity, being of opposite polarity to the stored charge, to the well terminal and the second semiconductor region with the source and drain regions either kept floating or at the same voltage bias.

(2) After a time interval, application of a second voltage bias, having an opposite polarity to the first voltage bias, to the control gate where the second voltage is operated during either the ramp up or the ramp down of the first voltage.

Thereby removing charge stored in the floating gate through the dielectric layer and into the well and source and drain regions.

The program method in the present invention comprising of the following steps:

(1) Application of a first voltage bias of one polarity, being of opposite polarity to the stored charge, to the control gate.

(2) After a time interval, resetting the first bias to zero and application of a second voltage bias, having an opposite polarity to the first voltage bias, to the well terminal and the second semiconductor region with the source and drain regions either kept floating or at the same voltage bias, where the second voltage is operated during either the ramp up or the ramp down of the first voltage.

Thereby storing charge from the well and source and drain regions into the floating gate through the dielectric layer.

The program and erase methods of the present invention introduces an innovative approach for the device operation by utilizing both existing and stress induced newly created traps. These traps assist in the operation of the device by serving as scattering centers for the propagating electron wave. There are several probable paths for a stored electron to take when travelling from the floating gate into the channel and vice versa which depend on these scattering centers. The said first voltage acts as a time varyine potential which in turn affects the phase component of the electron wave function for each possible path segment in a different manner through the interaction known as the Aharonov-B ohm (AB) effect. Given enough time during which the first voltage is being changed and the second voltage kept at its maximal absolute level, and due to the fact that the initial electron phase is random in nature, a constructive interference of the possible paths would result in a high probability for enough electrons to transit from the floating gate and into the channel thus changing the cell state from programmed to erased or vice versa. The formation of newly created traps in the dielectric during this operation is mostly of reversible nature due to the shorter period and lower magnitude of the electric field compared with the prior art. After the stress is removed the dielectric film will not suffer as much damage compared with prior art operation techniques. This methodology results in superior device reliability and lifetime especially in the sub micron regime.

Flash device operation is performed to a specific threshold voltage which only depends on the amount of charge added or removed from the floating gate. Thus, the present invention would yield higher tunneling currents without having the inevitable merits of strong electric fields exposure that usually accompany prior art methods. The present invention utilizes an electric field that is about half in magnitude then the one used in all prior art techniques and that has a shorter duration which gives higher immunity to the prior art reliability issues, which in turn have an exponential dependency on both the electric field's magnitude and duration.

In addition, the present invention has an inherent reduced likelihood for hot holes generation during device operation, which when injected into the dielectric layer lead to the creation of permanent traps and ultimately device breakdown.

Furthermore, reduction of the applied electric field between the control gate and the well would reduce the magnitude of the unwanted floating gate to control gate tunneling current for both program and erase and result in increased operation efficiency and lower power dissipation.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items.

Figure 1:
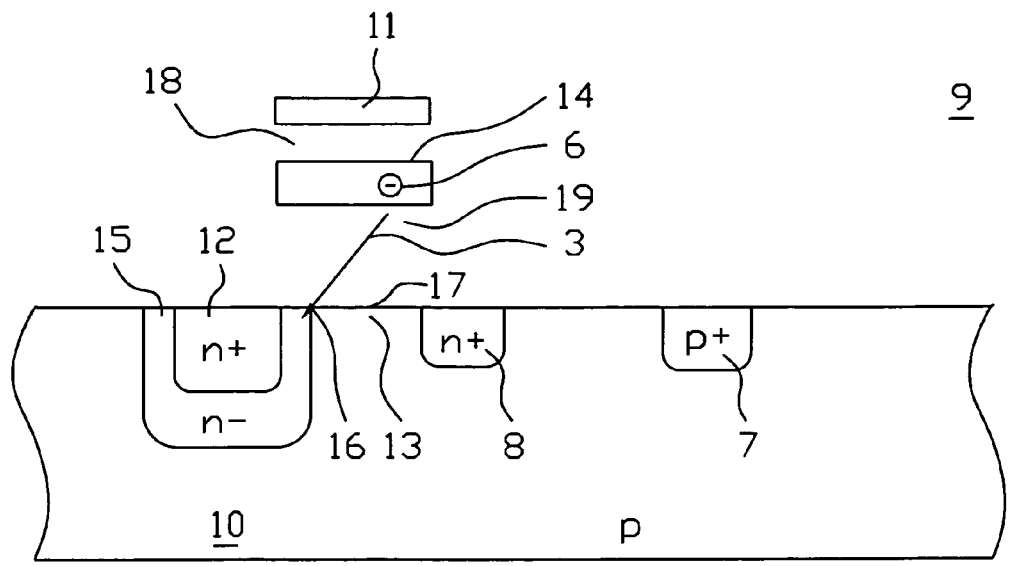
FIG. 1 is a cross sectional view of a flash EEPROM device in the prior art operated with the NGSE method.
Figure 2:
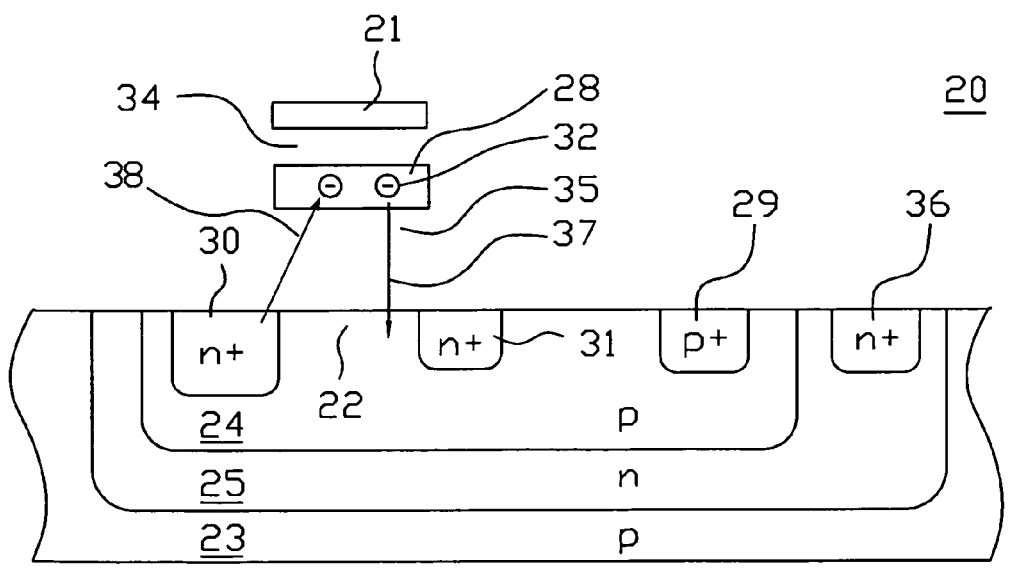
FIG. 2 is a cross sectional view of a flash EEPROM device in the prior art operated with the NGCE method.
Figure 3:
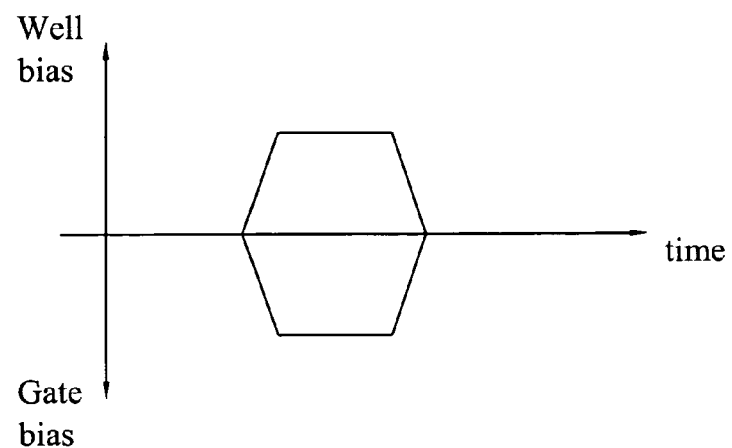
FIG. 3 depicts bias voltage waveform timing alignment used in all erase methods of prior art.
Figure 4:
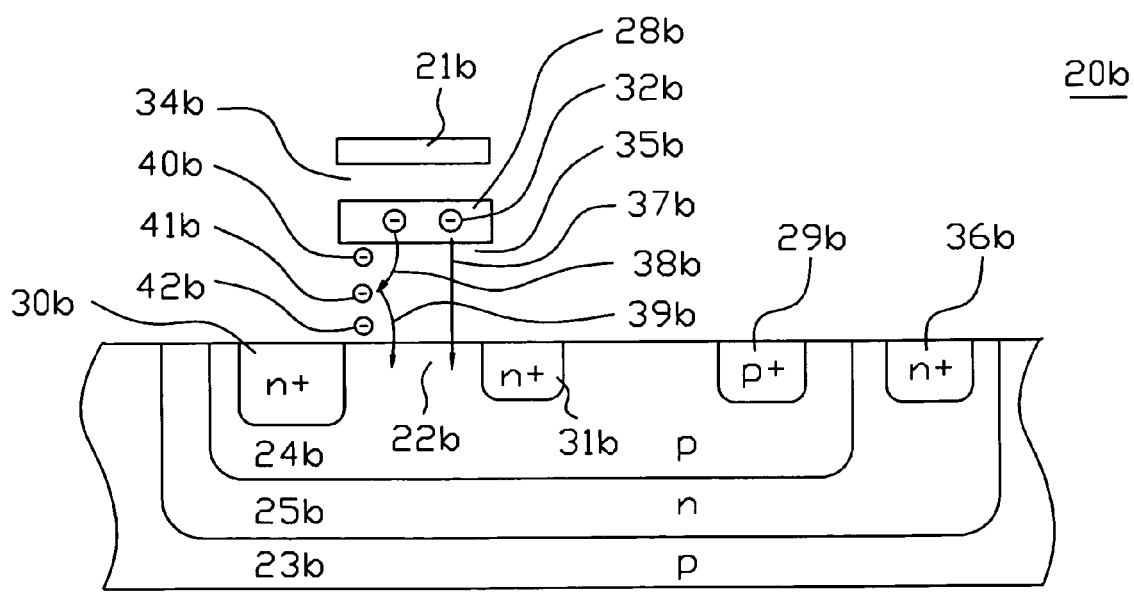
FIG. 4 is the same cross sectional view of FIG. 2 using corresponding reference numerals and showing the effect of erasing using the method presented in the present invention.
Figure 5:
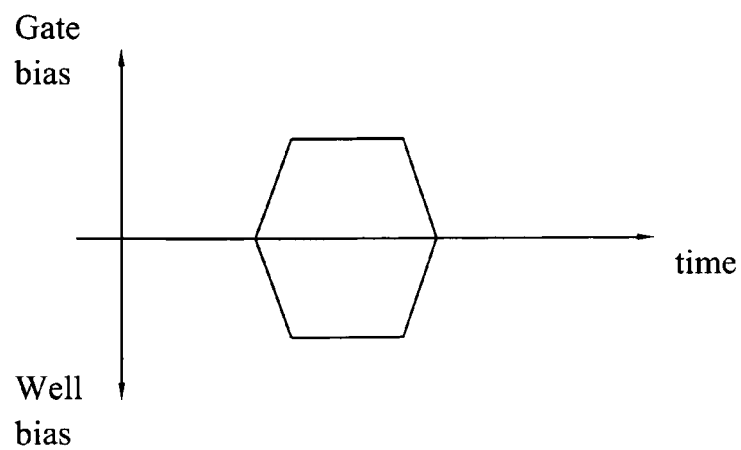
FIG. 5 depicts bias voltage waveform timing alignment used in all program methods of prior art.

FIG. 4 shows an embodiment of the present invention using an n-type flash EEPROM. The EEPROM device $20b$ is formed in a p-type triple well $24b$, formed within an n-type deep well $25b$, formed in a p-type substrate $23b$. The device has a control gate $21b$ that is formed above a floating gate $28b$ with an inter layer electrically isolating dielectric $34b$. The floating gate $28b$ is isolated from the channel area $22b$ by a dielectric layer $35b$ as well. The floating gate $28b$ is used as a charge storing layer, and may be made of a localized charge trapping material such as nitride, a non localized charge storing material such as poly silicon, an electric charge conducting material, or an isolating material. The drain $31b$ is formed from an n-type semiconductor as is the source $30b$. The triple well is contacted using highly doped p-type region $29b$ and the deep n-well is contacted using highly doped n-type region $36b$.

One of the underlying physical mechanisms utilized by the present invention is the well known Aharonov-B ohm (AB) effect where the presence of a voltage potential affects the phase component of the electron wave function. A prior art switching device utilizing the AB phenomena may be found in U.S. Pat. No. [9] 5,157,467. The phase component of the electron wave is known to depend on the potential through the following relation:

$$\theta = 2\pi e/ch \cdot V \cdot t$$

Where $\theta$ is the phase gained for spending a time period t with potential V. Changing the initial potential V in a controlled manner by a differential amount to $V+\Delta V$ for a given time $\Delta t$ would yield a different phase component change rate at each time step. By incrementally changing this phase factor $\theta$ each of a plurality of electrons $32b$ having a random initial wave function phase component and stored within the floating gate $28b$ may find an appropriate time interval with a corresponding $\theta$ which yields a constructive interference for a multi segmented path $37b$, $38b$, $39b$ leading to the channel $22b$ thus successfully completing the transition between the two regions. It can clearly be seen that virtually an infinite number of functions could be used to implement a potential having different derivatives $\Delta V/\Delta t$ for any given time t which would gain the same final result as long as the entire electron phase contribution $\Delta\theta$ is covered from 0 to $2\sigma$. The rate of change in the phase component $\Delta\theta/\Delta t$ is described in the relation:

$$\Delta\theta/\Delta t = 2\pi e/ch \cdot (V + t \cdot \Delta V/\Delta t)$$

Since the scattering centers within the dielectric may also introduce a phase factor to the corresponding path segment, the potential time variation may take numerous function forms to yield a constructive interference at some time point during the operation. For example a linear potential having a constant ramp rate may be chosen to compensate for scattering center having a constant phase contribution thus allowing for a constructive interference path to occur at a time point to during the operation. Since to depend on the initial electron phase, which is random in nature, the potential absolute value may be chosen so that the phase contribution is covered from 0 to 2 thus resulting in the electron transport. The nature of the physical phenomena is derived from the variation in time of the potential and having a rising or falling bias voltage would yield the same final results since the electron wave function phase component, which is cyclic, is affected by either a positive or a negative variation with time. Furthermore the above detailed descriptions do not assume a linear manner of setting or re-setting any of the mentioned voltage biases. It is obvious that the method described herein would work in a similar way for any shape of time varying voltages, being sinusoidal, exponential, linear or higher order polynomial functions to produce the same end results through the AB effect.

(a) Erase Operation

Figure 9:
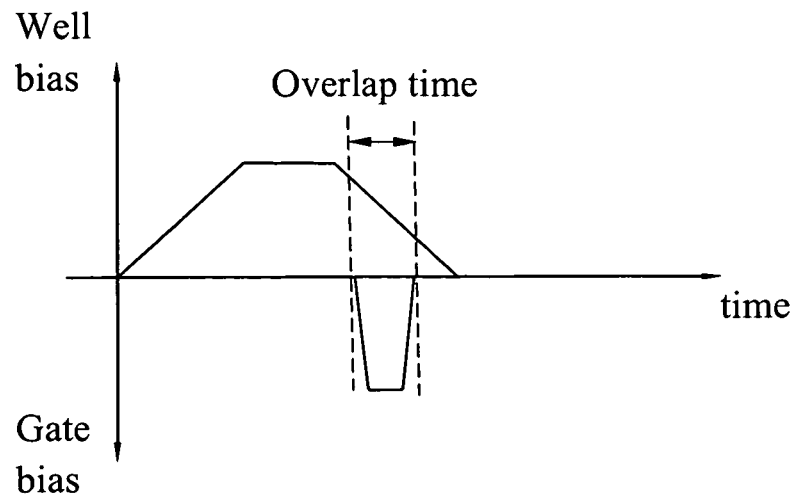
FIG. 9 depicts bias voltage waveform timing alignment used in the erase process in a configuration of the present invention.

In an embodiment of the present invention, erasing the flash device is accomplished by biasing the well and gate terminals as described in FIG. 9 in two stages. Referring to FIG. 9, the biasing voltage waveform time dependence used to operate the flash device during erase in a first manner of the current invention is depicted. The well biasing voltage is of a positive polarity and the gate biasing is of negative polarity. The well bias is triggered first and after a certain settling time period has elapsed it is reset back to zero when the gate negative bias is triggered during the ramp down phase of the well bias. The overlap time between the two pulses is depicted as well. The control gate biasing is operated entirely during the well voltage biasing ramp down.

In conclusion, the erase technique according to an embodiment of the present invention is accomplished by biasing the well and gate terminals in two stages. In the first stage a positive voltage is used to bias the triple well and in the second stage a negative voltage is used to bias the control gate. The two bias pulses have an overlap time as indicated in FIG. 9. Obviously, in an embodiment, a positive voltage may be used to simultaneously bias the triple well and source region in the first stage, and in another embodiment, a positive voltage may be used to simultaneously bias the triple well and the source and drain regions in the first stage.

Referring to FIG. 4, during the first erase stage, a positive voltage bias is applied to the triple p-type well 22b via the well terminal 29b. The deep n-type well 25b is kept floating while the p-type substrate 23b is generally grounded. The source 30b and drain 31b regions may be kept floating or biased using the same waveform as the triple well 22b. Once a certain time period has elapsed, the second stage is initiated during which a negative bias is applied to the control gate 21b and the well bias is reset back to zero. The erase sequence is finished when the control gate bias is reset back to zero.

Both surface state traps and inter dielectric traps (marked as 40b, 41b, and 42b in FIG. 4) serve as scattering centers for the electron wave in the embodiments of the present invention. There are several path segments marked as 37b, 38b, and 39b for a stored electron 32b to take from the floating gate 28b to the channel 22b which depend on these scattering centers. The said applied first voltage yields a time varying potential during the ramp phase which in turn affects the phase component of each possible path in a different manner through the AB effect. Given enough time, during which the said first voltage is being ramped and the said second voltage is kept at its maximal absolute level, and due to the fact that the initial electron phase is random in nature, a constructive interference of the possible paths would result in a high probability for most of the stored electrons to travel from the floating gate 28b and into the channel 22b to set the cells threshold level to an erased state. It is obvious to those skilled in the art that the operation method described herein may be accomplished alternatively by application of the said second voltage within the ramp up phase of the said first voltage rather than during the ramp down phase as described here for illustrative purposes. A direct result of this operation methodology is that the electric field formed over the dielectric interface is about half in magnitude of the ones used in all prior art techniques and shorter in duration as well. Both features mean higher immunity to the described reliability issues of the prior art, the latter having an exponential dependence on both the electric field's magnitude and duration. Using weaker electrical fields would considerably lower the tunneling from control gate 21b to floating gate 28b, a known factor to interfere with the erase process, and result in increased erase efficiency and lower power dissipation.

Erasing the device to a predetermined threshold level depends only on the quantity of electrons removed from the floating gate 28b. The present invention describes not only a more efficient method for removing this charge, thus exposing the device to shorter time periods of electrical field stress, but also allows the usage of weaker fields during erase since biasing is done in two consecutive stages. All prior art erasing techniques dictate the usage of simultaneous biasing schemes. These methodologies require stronger fields and longer erase times making them highly vulnerable to electrical stress induced reliability issues, in turn having an exponential dependence on both field strength and duration.

(b) Program Operation

Figure 10:
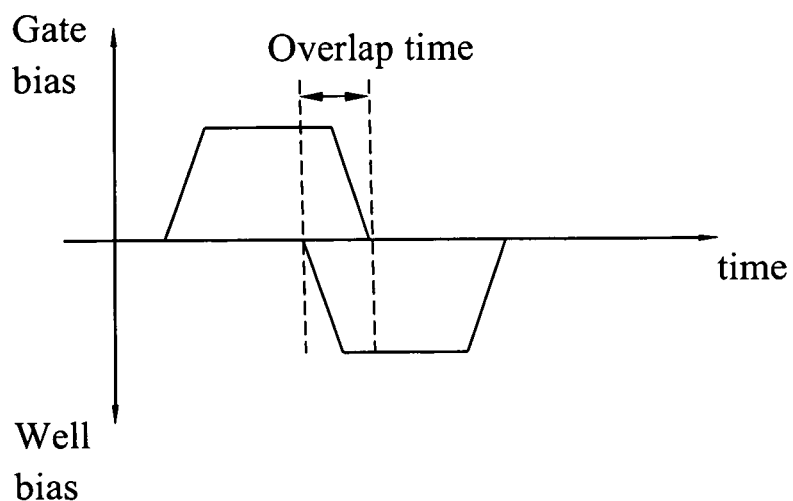
FIG. 10 depicts bias voltage waveform timing alignment used in the program process in one configuration of the present invention.
Figure 11:
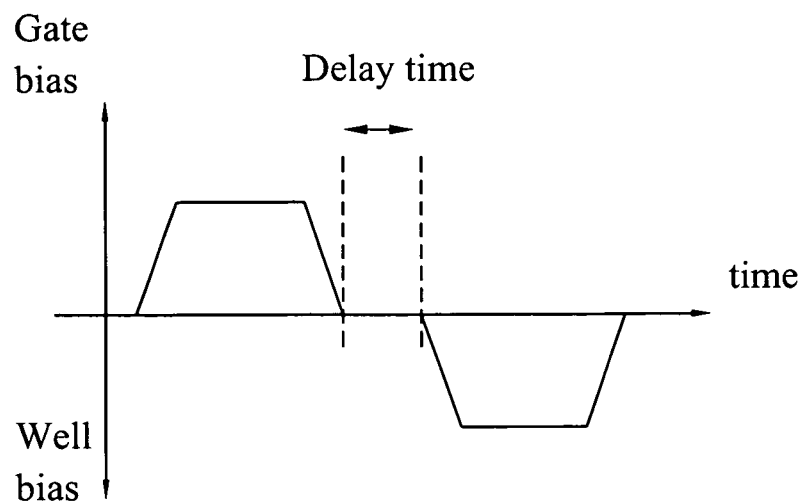
FIG. 11 depicts bias voltage waveform timing alignment used in the program process in a second configuration of the present invention.
Figure 12:
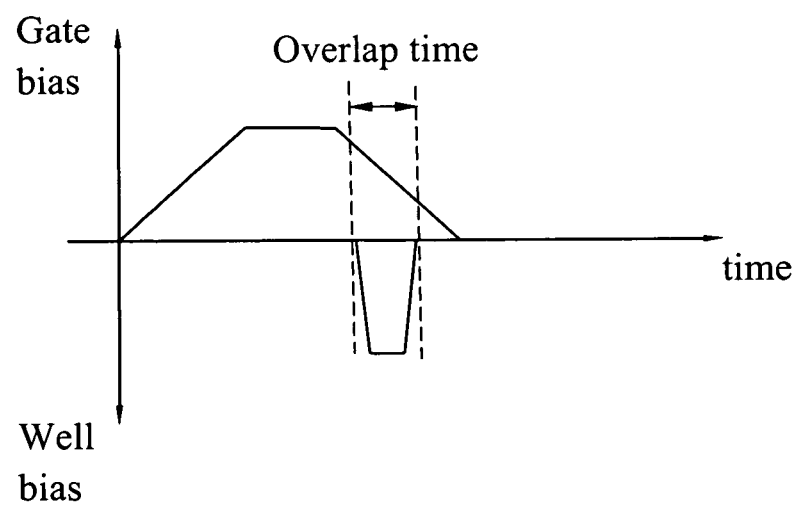
FIG. 12 depicts bias voltage waveform timing alignment used in the program process in a third configuration of the present invention.

In an embodiment of the present invention, programming the flash device is accomplished by biasing the well and gate terminals as described in FIG. 10 or FIG. 11 in two stages. Referring to FIG. 10, the biasing voltage waveform time dependence used to operate the flash device during program in a first manner of the current invention is depicted. The control gate biasing voltage is of a positive polarity and the well biasing is of negative polarity. The control gate bias is triggered first and after a certain settling time period has elapsed the well negative bias is triggered. The overlap time between the two pulses, which may or may not equal zero, is depicted as well. Referring to FIG. 11, the biasing voltage waveform time dependence used to operate the flash device during program in a second manner of the current invention is depicted. The control gate biasing voltage is of a positive polarity and the well biasing is of negative polarity. The control gate bias is triggered first and after a certain settling time period has elapsed it is reset back to zero. After another delay time period has elapsed, which may or may not equal zero, the well negative bias is triggered. The delay time between the two pulses is depicted as well. Referring to FIG. 12, the biasing voltage waveform time dependence used to operate the flash device during program in a third manner of the current invention is depicted. The well biasing is operated entirely during the control gate voltage biasing ramp down.

In conclusion, the program technique according to an embodiment of the present invention is accomplished by biasing the well and gate terminals in two stages. In the first stage a positive voltage is used to bias the control gate and in the second stage a negative voltage is used to bias the triple well. The two bias pulses may have an overlap time as indicated in FIG. 10 or a delay time as indicated in FIG. 11. Obviously, in an embodiment, a negative voltage may be used to simultaneously bias the triple well and source region in the second stage, and in another embodiment, a negative voltage may be used to simultaneously bias the triple well and the source and drain regions in the second stage.

Figure 6:
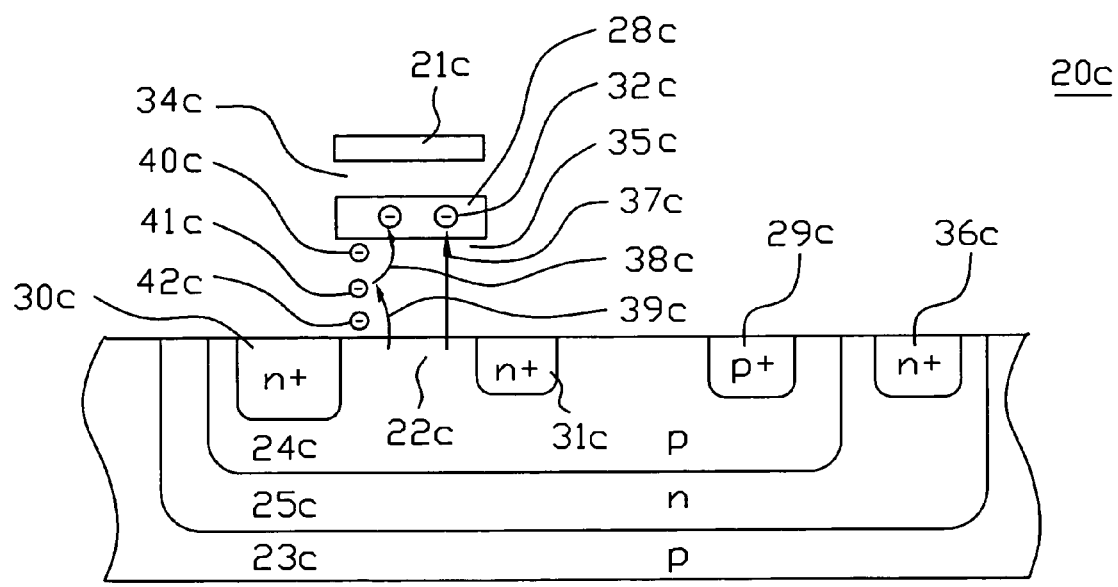
FIG. 6 is the same cross sectional view of FIG. 2 using corresponding reference numerals and showing the effect of programming using the method presented in the present invention.
Figure 7:
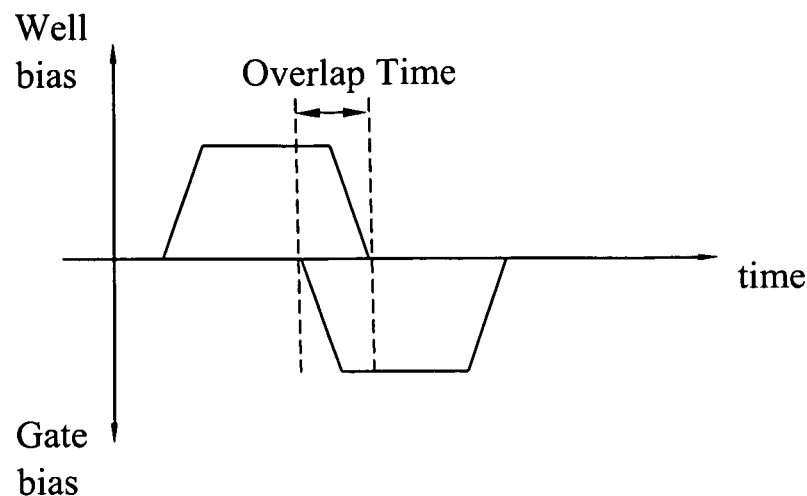
FIG. 7 depicts bias voltage waveform timing alignment used in the erase process in one configuration of the prior art.
Figure 8:
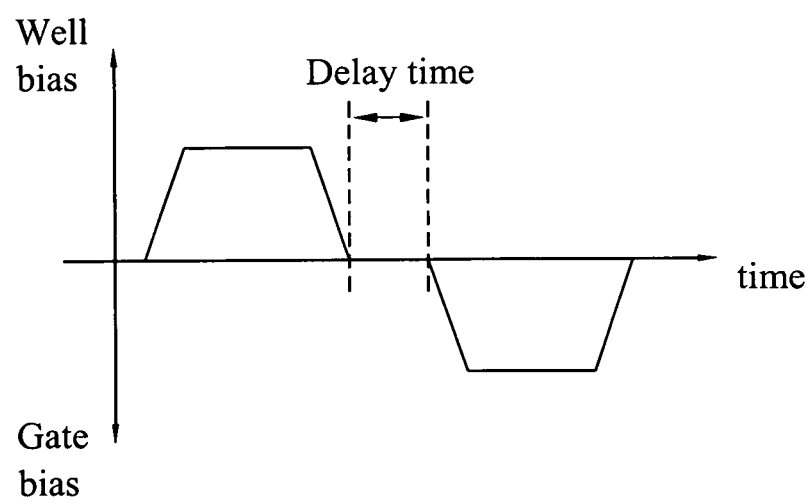
FIG. 8 depicts bias voltage waveform timing alignment used in the erase process in a second configuration of the prior art.

Referring to FIG. 6, during the first program stage a positive bias is applied to the control gate 21c. Once a certain time period has elapsed, the second stage is initiated during which a negative voltage bias is applied to the triple p-type well 22c via the well terminal 29c. The deep n-type well 25c is kept floating while the p-type substrate 23c is generally grounded. The source 30c and drain 31c regions may be kept floating or biased using the same waveform as the triple well 22c and the control gate bias is reset back to zero. The program sequence is finished when the triple well bias is reset back to zero.

In the embodiment of the program methods of the present invention both the inter dielectric traps (marked as 40c, 41c, and 42c in FIG. 6) and surface state traps serve as scattering centers for the electron wave. There are several probable path segments marked as 37c, 38c, and 39c for an electron 32c to take from the channel 22c into the floating gate 28c which depend on these scattering centers. The said applied first voltage yields a time varying potential during the ramp phase which in turn affects the phase component of each possible path in a different manner through the AB effect. Given enough time, during which the said first voltage is being ramped and the said second voltage is kept at its maximal absolute level, and due to the fact that the initial electron phase is random in nature, a constructive interference of the possible paths would result in a high probability for a sufficient number of electrons to travel from the channel 22c and into the floating gate 28c to set the cells threshold level to a programmed state. It is obvious to those skilled in the art that the operation method described herein may be accomplished alternatively by application of said second voltage within the ramp up phase of said first voltage rather than during the ramp down phase as described here for illustrative purposes. A direct result of this operation methodology is that the electric fields formed over the dielectric interface is about half in magnitude of the ones used in all prior art techniques and shorter in duration as well. Both features mean higher immunity to the described reliability issues of the prior art, the latter having an exponential dependence on both the electric field's magnitude and duration. Using weaker electrical fields would considerably lower the tunneling from control gate 21c to floating gate 28c, a known factor to interfere with the program process, and result in increased programming efficiency and lower power dissipation.

Programming the device to a predetermined threshold level depends only on the quantity of electrons added to the floating gate 28c. The present invention describes not only a more efficient method for storing this charge, thus exposing the device to shorter time periods of electrical field stress, but also allows the usage of weaker fields during program since biasing is done in two consecutive stages. All prior art programming techniques dictate the usage of simultaneous biasing schemes. These methodologies require stronger fields and longer program times making them highly vulnerable to electrical stress induced reliability issues, in turn having an exponential dependence on both field strength and duration.

(c)

It is clear to those skilled in the art that the erase and program operations could be accomplished using the methods described above also by interchanging the order and waveforms of the applied bias voltages while keeping their polarity. The erase operation could be done by first biasing the control gate in the first stage, having the waveform and timing previously affiliated with the well terminal, before biasing the well terminal in the second stage, having the waveform and timing previously affiliated with the control gate. In the same manner, the program operation could be done by first biasing the well terminal in the first stage, having the waveform and timing previously affiliated with the control gate, before biasing the control gate in the second stage, having the waveform and timing previously affiliated with the well terminal.

The above description is shown for an embodiment of the present invention using an n-type flash EEPROM for illustrative purposes. It is clear that the above operational description is valid for any kind of EEPROM device by using the same waveforms or reversing their polarity depending on the polarity of charge being manipulated and the type of semiconductor being used to implement the device. Based on the above, those skilled in the art would realize that the embodiments of the present invention described herein are illustrative only and are not in any way limiting. Other embodiments of this invention will be obvious to those skilled in the art in view of this description.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of operating a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well terminal formed from a semiconductor layer of the conductivity type inside the first semiconductor region, a charge storing layer electrically isolated from the first semiconductor region by a dielectric layer and having electric charge retention properties, and a control terminal electrically isolated from the charge storing layer by a inter layer dielectric and constructed in a manner to have an electric coupling to the charge storing layer, the method comprising the steps of:

applying a first voltage bias of first polarity to the well terminal;

allowing a first time period which may or may not equal zero to elapse;

resetting the first voltage bias to zero while during the ramp down phase of said voltage;

applying a second voltage bias of second polarity opposite to the first polarity to the control terminal;

allowing a second time period to elapse;

resetting the second voltage bias to zero.

2. The method of claim 1, wherein the voltage bias applied to the well terminal is of the same polarity with the stored charge and the voltage bias applied to the control gate is of opposite polarity to the stored charge in order to program the device.

3. The method of claim 1, wherein the voltage bias applied to the well terminal is of opposite polarity to the stored charge and the voltage bias applied to the control gate is of the same polarity with the stored charge in order to erase the device.

4. The method of claim 1, wherein the first voltage bias is applied to the control terminal and the second voltage bias is applied to the well terminal.

5. The method of claim 1, wherein the first voltage bias is simultaneously applied to the source region and the well terminal.

6. The method of claim 1, wherein the first voltage bias is simultaneously applied to the source and drain regions and the well terminal.

7. The method of claim 1, wherein the charge storing layer is based on a localized charge trapping material, a non localized charge storing material, an electric charge conducting material or an isolating material.

8. A method of operating a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well terminal formed from a semiconductor layer of the conductivity type inside the first semiconductor region, a charge storing layer electrically isolated from the first semiconductor region by a dielectric layer and having electric charge retention properties, and a control terminal electrically isolated from the charge storing layer by a inter layer dielectric and constructed in a manner to have an electric coupling to the charge storing layer, the method comprising the steps of:
- applying a first voltage bias of first polarity to the well terminal while during the ramp up phase of said voltage;
- allowing a first time period which may or may not equal zero to elapse;
- applying a second voltage bias of second polarity opposite to the first polarity to the control terminal;
- allowing a second time period to elapse; and
- resetting the second voltage bias to zero;
- allowing a third time period which may or may not equal zero to elapse;
- resetting the first voltage bias to zero.

9. The method of claim 8, wherein the voltage bias applied to the well terminal is of the same polarity with the stored charge and the voltage bias applied to the control gate is of opposite polarity to the stored charge in order to program the device.

10. The method of claim 8, wherein the voltage bias applied to the well terminal is of opposite polarity to the stored charge and the voltage bias applied to the control gate is of the same polarity with the stored charge in order to erase the device.

11. The method of claim 8, wherein the first voltage bias is applied to the control terminal and the second voltage bias is applied to the well terminal.

12. The method of claim 8, wherein the first voltage bias is simultaneously applied to the source region and the well terminal.

13. The method of claim 8, wherein the first voltage bias is simultaneously applied to the source and drain regions and the well terminal.

14. The method of claim 8, wherein the charge storing layer is based on a localized charge trapping material, a non localized charge storing material, an electric charge conducting material or an isolating material.

15. A method of operating a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well terminal formed from a semiconductor layer of the conductivity type inside the first semiconductor region, a charge storing layer electrically isolated from the first semiconductor region by a dielectric layer and having electric charge retention properties, and a control terminal electrically isolated from the charge storing layer by a inter layer dielectric and constructed in a manner to have an electric coupling to the charge storing layer, the method comprising the steps of:
- applying a first voltage bias of first polarity, being of the same polarity as the stored charge, to the well terminal and characterized by an initiation time point, at which the bias begins to ramp up, a steady state time period, which may or may not equal zero, during which the bias is kept steady, and a reset time point, at which the bias begins to reset back to zero;
- applying a second voltage bias of second polarity opposite to the first polarity, being of the opposite polarity to the stored charge, to the control terminal and characterized by an initiation time point, at which the bias begins to ramp up, a steady state time period, which may or may not equal zero, during which the bias is kept steady, and a reset time point, at which the bias begins to reset back to zero;
- and having the second voltage bias initiation time point equal to or later than the first voltage reset time point, in order to program the device.

16. The method of claim 15, wherein the first voltage bias, being of the opposite polarity with the stored charge, is applied to the control terminal and the second voltage bias, being of the same polarity with the stored charge, is applied to the well terminal.

17. The method of claim 15, wherein the first voltage bias is simultaneously applied to the source region and the well terminal.

18. The method of claim 15, wherein the first voltage bias is simultaneously applied to the source and drain regions and the well terminal.

19. The method of claim 15, wherein the second voltage bias initiation time point occurs after the first voltage reset time point but before the first voltage reaches a zero level bias and the second voltage reset time point occurs after the first voltage reaches a zero level bias.

20. The method of claim 15, wherein the second voltage bias initiation time point occurs after the first voltage reaches a zero level bias.

\* \* \* \* \*